US009252510B2

(12) United States Patent
Lin et al.

(10) Patent No.: US 9,252,510 B2

(45) Date of Patent: Feb. 2, 2016

(54) SOLDERING STRUCTURE FOR MOUNTING CONNECTOR ON FLEXIBLE CIRCUIT BOARD

(71) Applicant: ADVANCED FLEXIBLE CIRCUITS CO., LTD., Taoyuan County (TW)

(72) Inventors: Gwun-Jin Lin, Taoyuan County (TW); Kuo-Fu Su, Taoyuan Country (TW); Chih-Heng Chuo, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 149 days.

(21) Appl. No.: 14/068,041

(22) Filed: Oct. 31, 2013

(65) Prior Publication Data

US 2014/0144678 A1 May 29, 2014

(30) Foreign Application Priority Data

Nov. 23, 2012 (TW) ............................ 101143861 A

(51) Int. Cl.

*H05K 1/00* (2006.01)
*H01B 7/08* (2006.01)
*H01R 12/00* (2006.01)
*H01R 12/59* (2011.01)
*H01R 43/02* (2006.01)

(52) U.S. Cl.

CPC .......... *H01R 12/592* (2013.01); *H01R 43/0256* (2013.01)

(58) Field of Classification Search

CPC ...................................................... H01R 12/59

USPC ........... 174/117 F, 117 FF, 254; 439/83, 260, 439/329

See application file for complete search history.

(56) References Cited

U.S. PATENT DOCUMENTS

| | | | | | |
|---|---|---|---|---|---|
| 4,373,655 | A * | 2/1983 | McKenzie, Jr. | ............... | 174/263 |
| 4,742,431 | A * | 5/1988 | Igarashi | ........................ | 174/538 |
| 4,894,015 | A * | 1/1990 | Stockero et al. | ................ | 439/67 |
| 6,172,306 | B1 * | 1/2001 | Downey | ........................ | 174/261 |
| 6,969,807 | B1 * | 11/2005 | Lin et al. | .................... | 174/117 F |
| 8,057,248 | B1 * | 11/2011 | Sherman | ....................... | 439/324 |
| 2005/0048809 | A1 * | 3/2005 | Bolen et al. | ..................... | 439/67 |
| 2009/0242262 | A1 * | 10/2009 | Asano | .......................... | 174/267 |
| 2012/0184130 | A1 * | 7/2012 | Yaguchi et al. | ........... | 174/117 F |

* cited by examiner

*Primary Examiner* — Chau N Nguyen
*Assistant Examiner* — Roshin Varghese
(74) *Attorney, Agent, or Firm* — Rosenberg, Klein & Lee

(57) ABSTRACT

Disclosed is a soldering structure for mounting at least one connector on a flexible circuit board. The connector includes SMD pins and solder-dipping pins. The flexible circuit board has a connector mounting section having a component surface on which SMD soldering zones and solder-dipping pin holes are formed. A reinforcement plate is coupled to a reinforcement bonding surface of the flexible circuit board. The reinforcement plate has through holes corresponding to the solder-dipping pin holes of the flexible circuit board. The SMD pins of the connector are respectively soldered to the SMD soldering zones of the flexible circuit board, and the solder-dipping pins of the connector are respectively inserted through the solder-dipping pin holes of the flexible circuit board and the through holes of the reinforcement plate to the soldering surface of the reinforcement plate to be soldered with a solder material.

20 Claims, 12 Drawing Sheets

SOLDERING STRUCTURE FOR MOUNTING CONNECTOR ON FLEXIBLE CIRCUIT BOARD

BACKGROUND OF THE INVENTION

1. Field of the Invention

The present invention relates to a mounting structure of a flexible circuit board and a connector, and in particular to a mounting structure that comprises a reinforcement plate coupled to a flexible circuit board.

2. The Related Arts

Printed circuit boards often possess the high strength nature of regular circuit board substrates so that they suffer hardly any problem in making connection with electronic component, insertion components, and insertion sockets provided in electronic devices. However, for the miniaturized, compact, and light-weighted electronic products that are prevailing in the present time, the conventional printed circuit boards do not suit the desired applications and are substituted by flexible circuit boards. Particularly, in electronic devices (such as mobile phones and cameras), where flexible manipulation, rotatable manipulation, and slidable manipulation may be desired, connections between circuits are often realized with flexible circuit boards.

In the current trend that requires miniaturization, light-weight, high pin density, and sophisticated pin gap, it is common to use SMD (Surface Mounted Device) technology to solder components, such as connectors and electronic devices, to contacts of a flexible circuit board. In a practical application of such an arrangement to an electronic device, components, such as connectors and electronic devices, may not achieve the same soldering and positioning performance as those made in a regular printed circuit board.

SUMMARY OF THE INVENTION

In the known techniques of bonding a component, such as an electronic device, to a flexible circuit board, the pins of the component, such as a connector and an electronic device are only fixed through soldering made between SMD pins and corresponding SMD soldering zones. Such a component, such as a connector and an electronic device, may be detached from the flexible circuit board or the electrical connection of the SMD contact may get damaged due to frequent removals and insertions made by users.

Although the flexible circuit board shows certain advantages, being constrained by the flexibility of the material used, it is desired to provide a firm connection between a component, such as a connector and an electronic device, and a flexible circuit board when the flexible circuit board is used in an electronic device that requires flexible manipulation, rotatable manipulation, and slidable manipulation and that requires frequent removals and insertions made by users.

Further, the contemporary electronic devices often use high frequency differential mode signals in the transmission of signal. In the transmission of high frequency differential mode signals, it is often overlooked of the importance of impedance control and mistakes and distortions of the transmission of signal may result. Particularly, when a flexible circuit board carries thereon differential mode signal lines, due to the characteristics of the flexible circuit board being flexible and bendable, the transmission of the differential mode signal is readily affected by adverse factors including the surrounding environment, the lines themselves, and poor impedance control.

Thus, the primary object of the present invention is to provide a soldering structure for mounting at least one connector on a flexible circuit board. Through improvement made on the coupling structure between the flexible circuit board and the connector, coupling stability and mechanical strength therebetween can be enhanced.

Another object of the present invention is to provide an easy positioning and coupling structure of a flexible circuit board and a connector, in which a simple way of mounting a reinforcement plate to the flexible circuit board at a location corresponding to the connector is adopted, whereby with structures of through holes formed in the flexible circuit board and the reinforcement plate, easy assembling, enhancement of tension strength, and stability of coupling can be achieved.

The technical solution adopted in the present invention is that a connector is provided with a plurality of SMD pins and a plurality of solder-dipping pins and a flexible circuit board is provided, correspondingly, with a plurality of SMD soldering zones and a plurality of solder-dipping pin holes formed on a component surface of a connector mounting section. A reinforcement plate is coupled to the reinforcement bonding surface of the flexible circuit board and the reinforcement plate is provided with a plurality of through holes corresponding to the solder-dipping pin holes of the flexible circuit board. The SMD pins of the connector are respectively soldered to the SMD soldering zones of the flexible circuit board, and the solder-dipping pins of the connector are respectively inserted through the solder-dipping pin holes of the flexible circuit board and the through holes of the reinforcement plate to the soldering surface of the reinforcement plate to be soldered by a solder material.

In a preferred embodiment of the present invention, at least one jumper via hole and a conductive path are included to serve as jumper connection for signals. In an attempt to extend the flexible circuit board through for example a hinge, the flexible circuit board can be cut with cutting lines to form a plurality of cluster lines, which is then bundled together to form a bundled structure. Further, the flexible circuit board can be a single-side board, a double-sided board, or a multiple-layer board.

In another preferred embodiment of the present invention, each of solder-dipping pin holes formed in the flexible circuit board has an inner circumferential surface on which a first conductive layer and an extended portion are formed. Each of through holes of the reinforcement plate has an inner circumferential surface on which a second conductive layer and an extended portion are formed. With the flexible circuit board and the reinforcement plate bonded with an adhesive material layer, the extended portion of the first conductive layer and the extended portion of the second conductive layer form therebetween a solder filling gap, whereby a solder material is allowed to flow along the solder-dipping pin of the connector and the through hole of the reinforcement plate to fill into the solder filling gap so that electrical connection can be firmly established between the first conductive layer of the solder-dipping pin hole of the flexible circuit board and the second conductive layer of the through hole of the reinforcement plate.

In a further preferred embodiment of the present invention, one or multiple arrays of SMD pins and solder-dipping pins are formed on the connector and the component surface of the flexible circuit board is provided, correspondingly, with one or multiple arrays of SMD soldering zones and solder-dipping pin holes, whereby advantages of flexibility of pin arrangement and enhanced bonding strength can be achieved.

With the technical solution adopted in the present invention, the drawback of the conventional connector that the bonding strength of the pins thereof only relies on the SMD pins and the SMD soldering zones and is generally poor can be overcome to ensure the electrical connection of the SMD contacts between the connector and the flexible circuit board and to thereby allows the present invention to be particularly applicable to conditions where frequent removals and insertions by users are needed. Further, the present invention has a simple bonding structure, requiring no modification of the existing circuit lay-out, structure, and signal pins, of a flexible circuit board, and assembling is also easy.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
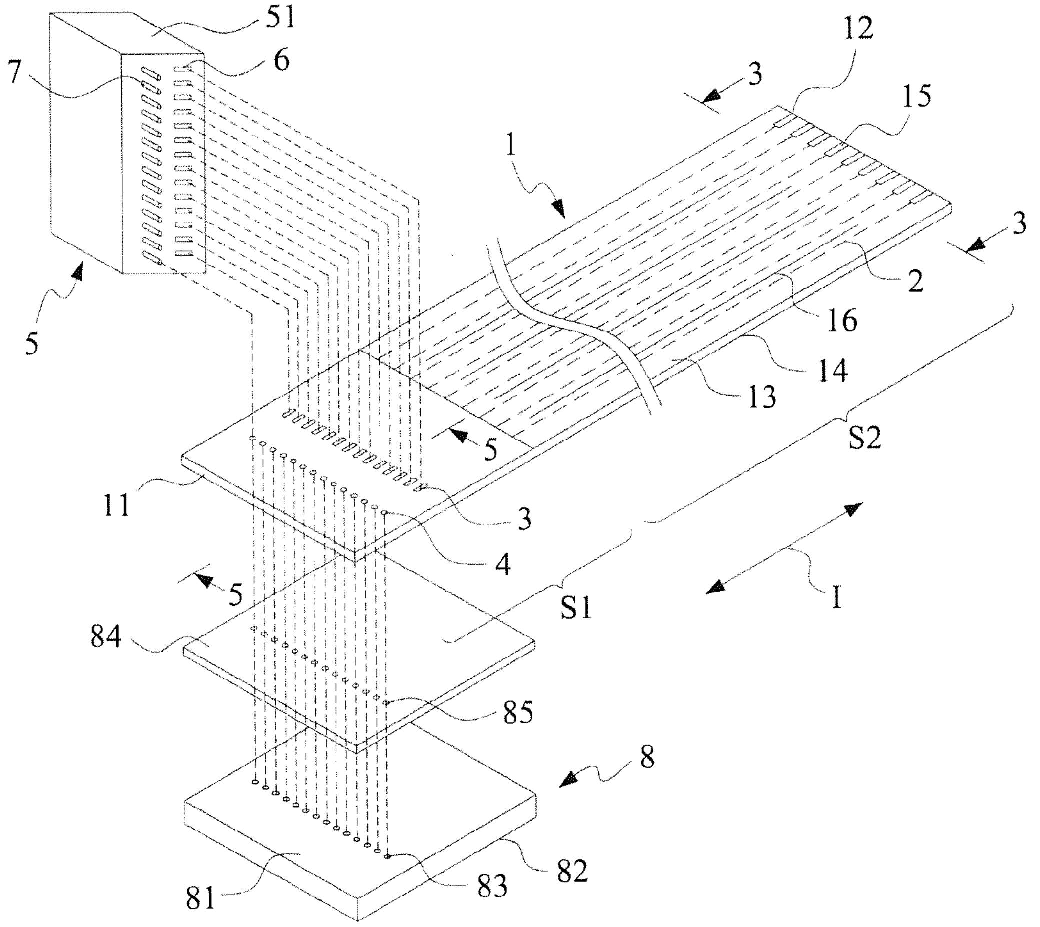
FIG. 1 is an exploded view showing a first embodiment of the present invention, with all components being detached from each other.
Figure 2:
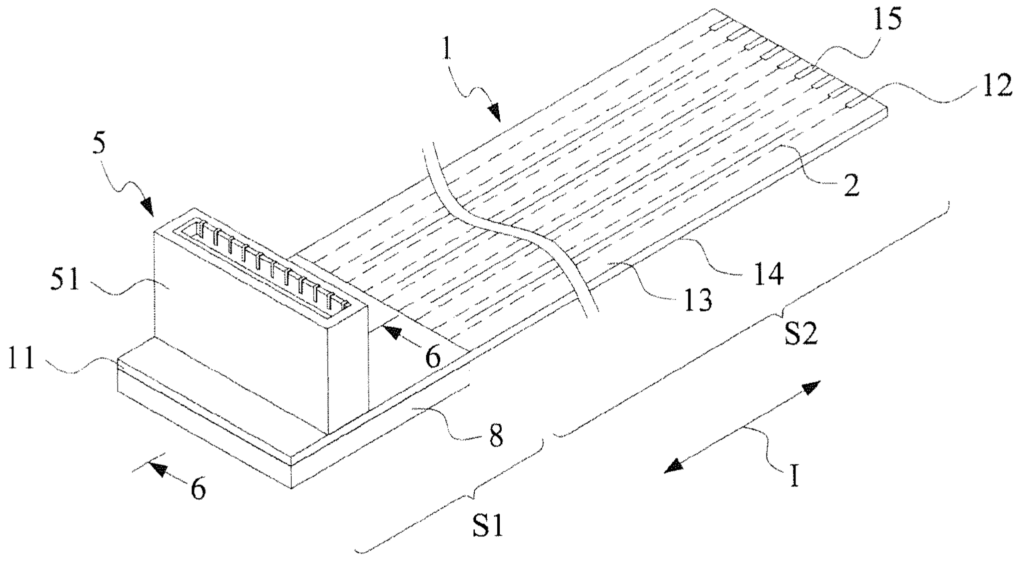
FIG. 2 is a perspective view showing the first embodiment of the present invention, with all components being assembled together.

With reference to the drawings and in particular to FIGS. 1 and 2, a flexible circuit board 1 according to a first embodiment of the present invention comprises a first end 11 and a second end 12, and a connector mounting section S1 formed adjacent to the first end 11 of the flexible circuit board 1. A first extension section S2 is formed and extends in an extension direction I between the first end 11 and the second end 12. The first extension section S2 comprises a plurality of conductor lines 2. The flexible circuit board 1 comprises a component surface 13 and a reinforcement bonding surface 14. The component surface 13 is provided with a plurality of SMD soldering zones 3 and is also provided with a plurality of solder-dipping pin holes 4 at locations close to the SMD soldering zones 3.

The second end 12 of the flexible circuit board 1 forms a golden finger insertion structure 15 that is known. The connector mounting section S1 of the first end 11 of the flexible circuit board 1 is coupled to a connector 5, which comprises a connector body 51 and a plurality of SMD pins 6 and a plurality of solder-dipping pins 7 formed on the connector body 51. The SMD pins 6 and the solder-dipping pins 7 correspond, respectively, to the SMD soldering zones 3 and the solder-dipping pin holes 4 of the component surface 13 of the flexible circuit board 1.

The reinforcement bonding surface 14 of the flexible circuit board 1 is coupled to a reinforcement plate 8, which comprises a bonding surface 81 and a soldering surface 82, wherein the bonding surface 81 is mounted to the reinforcement bonding surface 14 of the flexible circuit board 1. The reinforcement plate 8 comprises a plurality of through holes 83 formed therein. The through holes 83 correspond respectively to the solder-dipping pin holes 4 of the flexible circuit board 1.

An adhesive material layer 84 is interposed between the flexible circuit board 1 and the reinforcement plate 8. The adhesive material layer 84 also comprises a plurality of pre-formed holes 85 corresponding to the through holes 83 of the reinforcement plate 8. The pre-formed holes 85 have a hole diameter that is greater than the hole diameter of the through holes 83. The adhesive material layer 84 can be one of a pressure-sensitive adhesive or a thermal-sensitive adhesive.

Figure 3:
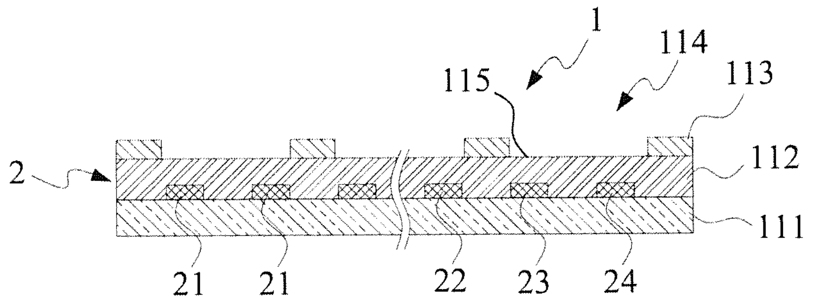
FIG. 3 is a cross-sectional view taken along line 3-3 of FIG. 1.

For selection of material, the flexible circuit board 1 comprises a substrate that can be a single-sided board, a double-sided board, or a multiple-layer board made of one of flexible PET (Polyester) and PI (Polyimide), and the reinforcement plate 8 is selected from one of a glass fiber substrate, PI, ceramics, aluminum plate. For example, as shown in FIG. 3, in an example where the flexible circuit board 1 is a single-sided board, the component surface 13 of the flexible circuit board 1 may comprises a shielding layer 113 formed thereon and the shielding layer 113 forms an impedance control structure 114. In the flexible circuit board 1 of a single-sided board configuration, the structure thereof comprises a substrate 111 and the substrate 111 has an upper surface on which a plurality of parallel conductor lines 2 is formed. The conductor lines 2 may comprises at least one pair of differential mode conductor lines 21, so that every two of the differential mode conductor lines 21 are paired to transmit a differential mode signal. The differential mode conductor lines 21 are preferably connected to the SMD pins 6 of the connector 5. The conductor lines 2 may also comprise at least one common mode conductor line 22 and the common mode conductor line 22 is preferably connected to the solder-dipping pins 7 of the connector 5. The conductor lines 2 may further comprise at least one power line 23 or grounding line 24. The power line 23 or the grounding line 24 is preferably connected to the solder-dipping pins 7 of the connector 5.

An insulation layer 112 is formed on the upper surface of the substrate 111 to cover each of the conductor lines 2. A shielding layer 113 is formed on a surface of the insulation layer 112 and the shielding layer 113 may form an impedance control structure 114. The impedance control structure 114 is formed to correspond to the conductor lines 2 of the flexible circuit board 1 to serve as an impedance control structure for the conductor lines 2 transmitting differential mode signals. In a practical example, the impedance control structure 114 is made up of a plurality of openings 115 formed in the shielding layer. The openings 115 can be of a variety of geometric shapes, such as circle, rhombus, and rectangle.

Figure 4:
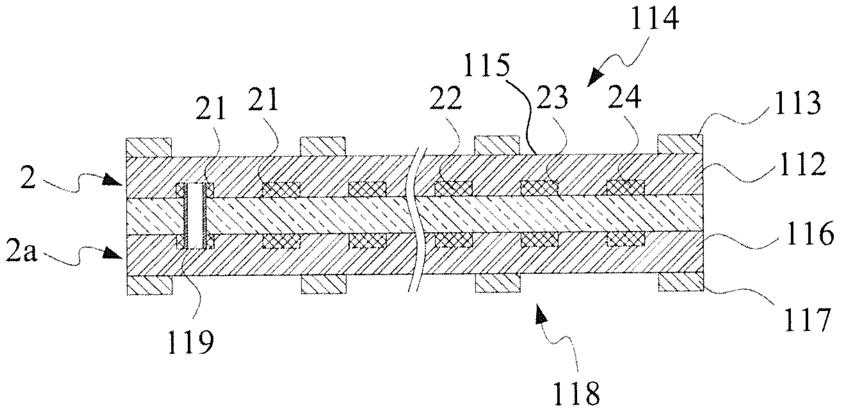
FIG. 4 is a cross-sectional view illustrating an embodiment of the present invention in which a flexible circuit board is made in the form of a double-sided board.

Referring to FIG. 4, in an embodiment, where the flexible circuit board 1 is a double-sided board, a shielding layer 113 is provided on the component surface 13 of the flexible circuit board 1 and the shielding layer 113 forms an impedance control structure 114; a lower shielding layer 117 is provided on the reinforcement bonding surface 14 of the flexible circuit board 1 and the lower shielding layer 117 forms a lower impedance control structure 118. The flexible circuit board 1 of a double-sided board configuration comprises a substrate 111 and conductor lines 2, an insulation layer 112, the shielding layer 113, and the impedance control structure 114 formed on an upper surface of the substrate 111. The conductor lines 2 comprise at least one pair of differential mode conductor lines 21, at least one common mode conductor line 22, at least one power line 23, and at least one grounding line 24. In addition, the substrate 111 has a lower surface that forms a corresponding arrangement, which comprises a lower conductor lines 2*a*, a lower insulation layer 116, a lower shielding layer 117, a lower impedance control structure 118, and at least one conductive via hole 119 connecting between the conductor lines 2 and the lower conductor lines 2*a*.

Figure 5:
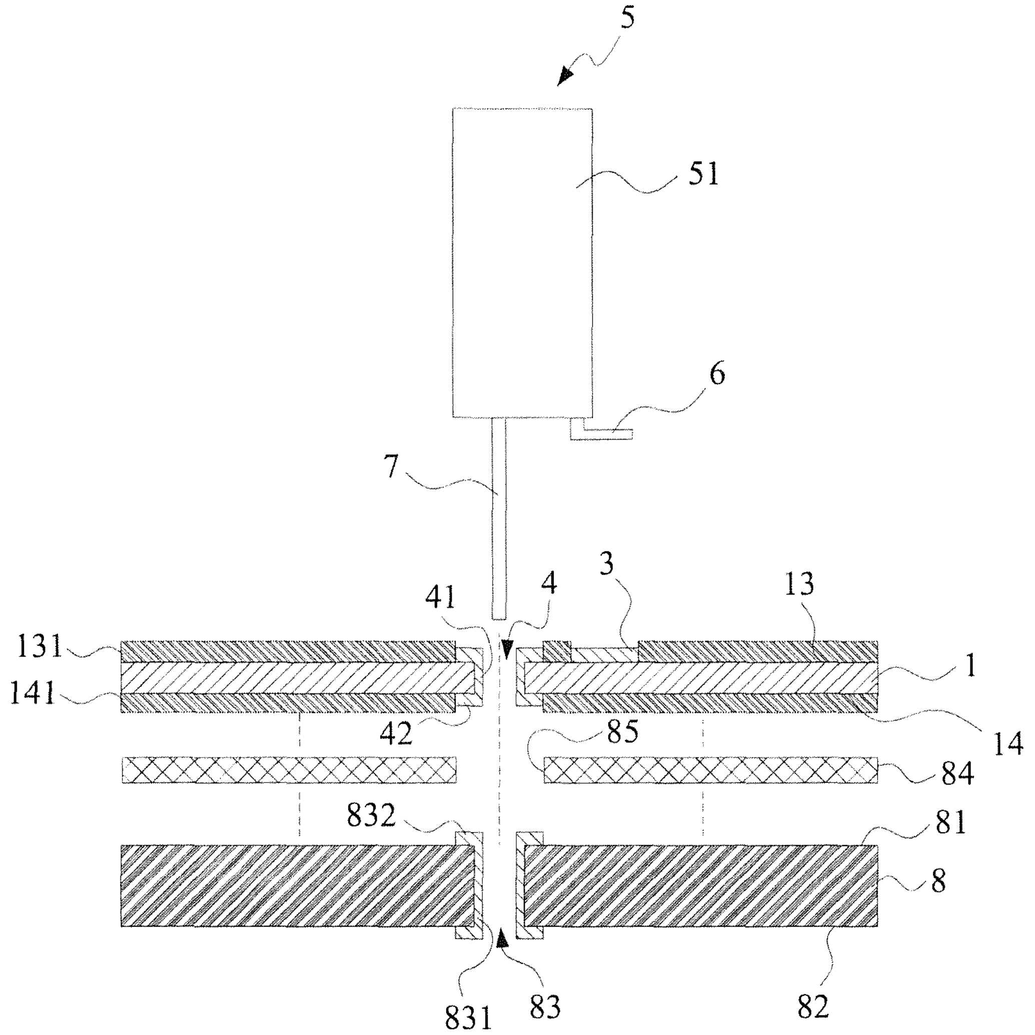
FIG. 5 is a cross-sectional view taken along line 5-5 of FIG. 1, showing a condition that all components of the first embodiment of the present invention are detached from each other.

Referring to FIG. 5, the component surface 13 of the flexible circuit board 1 is shown provided with a plurality of SMD soldering zones 3 and a plurality of solder-dipping pin holes 4. The component surface 13 of the flexible circuit board 1 can be coupled to a connector 5, which comprises a connector body 51 and a plurality of SMD pins 6 and a plurality of solder-dipping pins 7 formed on the connector body 51. The SMD pins 6 and the solder-dipping pins 7 correspond, respectively, to the SMD soldering zones 3 and the solder-dipping pin holes 4 of the component surface 13 of the flexible circuit board 1.

The solder-dipping pin holes 4 of the flexible circuit board 1 each have an inner circumferential surface on which a first conductive layer 41 is formed. The first conductive layer 41 comprises an extended portion 42 of a predetermined thickness formed on the reinforcement bonding surface 14 and a corresponding extended portion formed on the component surface 13. The component surface 13 and the reinforcement bonding surface 14 of the flexible circuit board 1 are each provided with an insulation covering layer 131, 141, which a circumferential area and the extended portion 42 of each of the solder-dipping pin holes 4.

The reinforcement bonding surface 14 of the flexible circuit board 1 is coupled to a reinforcement plate 8, which comprises a bonding surface 81 and a soldering surface 82, wherein the bonding surface 81 is mounted to the reinforcement bonding surface 14 of the flexible circuit board 1. The reinforcement plate 8 comprises a plurality of through holes 83 formed therein and the through holes 83 respectively correspond to the solder-dipping pin holes 4 of the flexible circuit board 1.

The through holes 83 of the reinforcement plate 8 each have an inner circumferential surface on which a second conductive layer 831 is formed. The second conductive layer 831 comprises an extended portion 832 of a predetermined thickness formed on the bonding surface 81 and a corresponding extended portion formed on the soldering surface 82.

An adhesive material layer 84 is bonded between the insulation covering layer 141 of the flexible circuit board 1 and the bonding surface 81 of the reinforcement plate 8. The adhesive material layer 84 also comprises a plurality of pre-formed holes 85 corresponding to the through holes 83.

Figure 6:
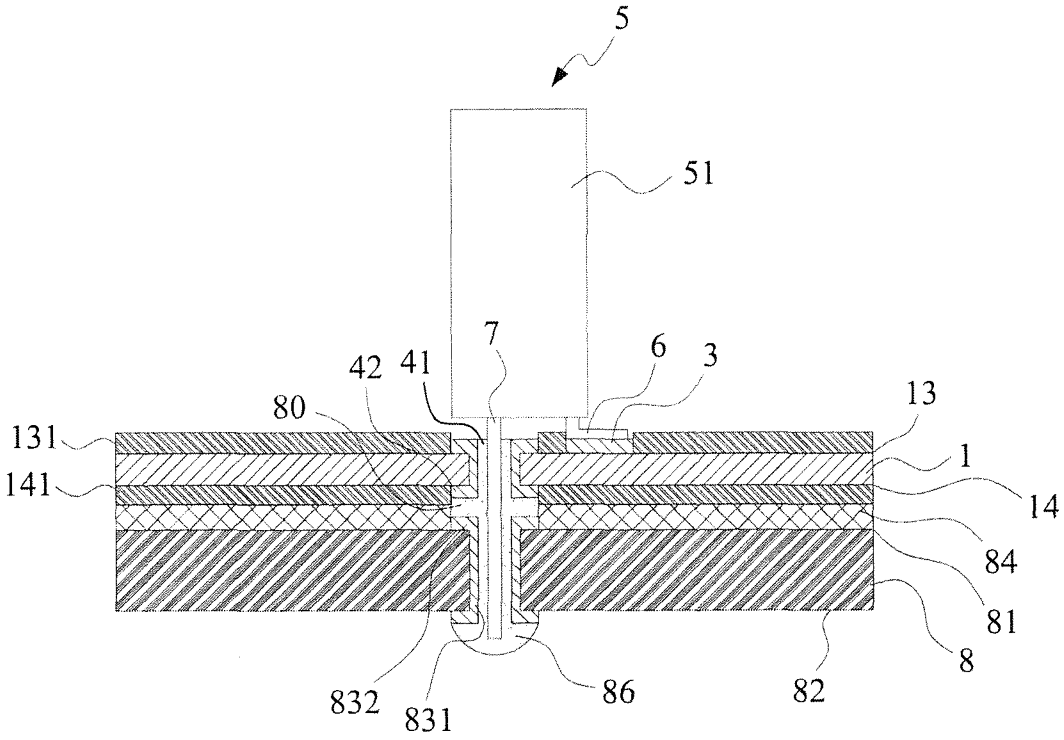
FIG. 6 is a cross-sectional view showing the first embodiment of the present invention in a condition that all the components are assembled together.

Also referring to FIG. 6, the SMD pins 6 of the connector 5 are soldered respectively to the SMD soldering zones 3 of the flexible circuit board 1 and the solder-dipping pins 7 of the connector 5 are inserted, from the component surface 13 of the flexible circuit board 1, through the solder-dipping pin holes 4 of the flexible circuit board 1, the holes 85 of the adhesive material layer 84, and the through holes 83 of the reinforcement plate 8, respectively, to the soldering surface 82 of the reinforcement plate 8. A solder material 86 is the applied to solder the solder-dipping pins 7 of the connector 5 to the through holes 83 of the reinforcement plate 8 and also forming electric connection between the solder-dipping pin holes 4 of the flexible circuit board 1 and the through holes 83 of the reinforcement plate 8.

When the adhesive material layer 84 is bonded between the insulation covering layer 141 of the flexible circuit board 1 and the bonding surface 81 of the reinforcement plate 8, due to the thickness of the adhesive material layer 84, a solder filling gap 80 is formed between the extended portion 42 of the first conductive layer 41 and the extended portion 832 of the second conductive layer 831. Thus, when the solder material 86 is applied to solder the solder-dipping pins 7 of the connector 5 to the through holes 83 of the reinforcement plate 8, besides forming electrical connection between the solder-dipping pin holes 4 and the second conductive layer 831 and the extended portion 832, the solder material 86 also flows along the solder-dipping pins 7 and the through holes 83 of the reinforcement plate 8 to fill in the solder filling gap 80, so that a firm and sound electric connection can be formed and established between the first conductive layer 41 of the solder-dipping pin holes 4 and the second conductive layer 831 of the through holes 83.

Figure 7:
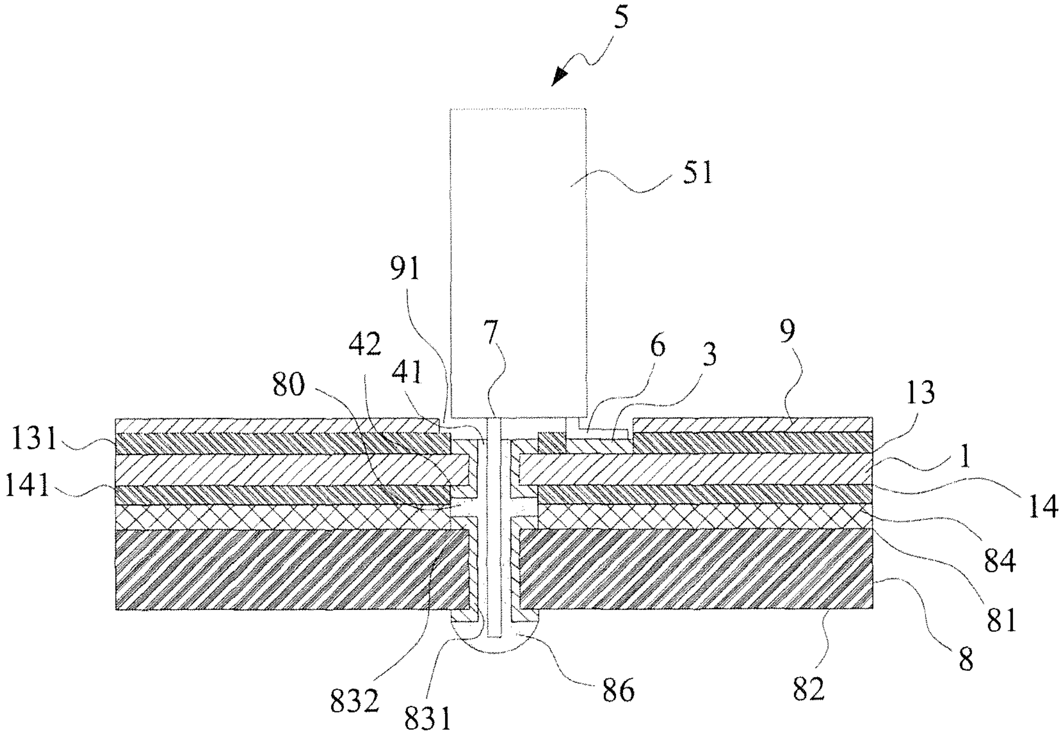
FIG. 7 is a cross-sectional view showing an embodiment where a component surface of the flexible circuit board of the first embodiment of the present invention is further bonded to an upper reinforcement plate.

Referring to FIG. 7, another embodiment of the present invention is shown, where an upper reinforcement plate 9 is further provided and mounted to the component surface 13 of the flexible circuit board 1. The upper reinforcement plate 9 comprises at least one exposed zone 91 formed therein, whereby when the upper reinforcement plate 9 is mounted to the component surface 13 of the flexible circuit board 1, the SMD soldering zones 3 and the solder-dipping pin holes 4 of the component surface 13 of the flexible circuit board 1 can be exposed and an accommodation space for the connector 5 is provided to facilitate soldering and insertion operations of the connector 5.

Figure 8:
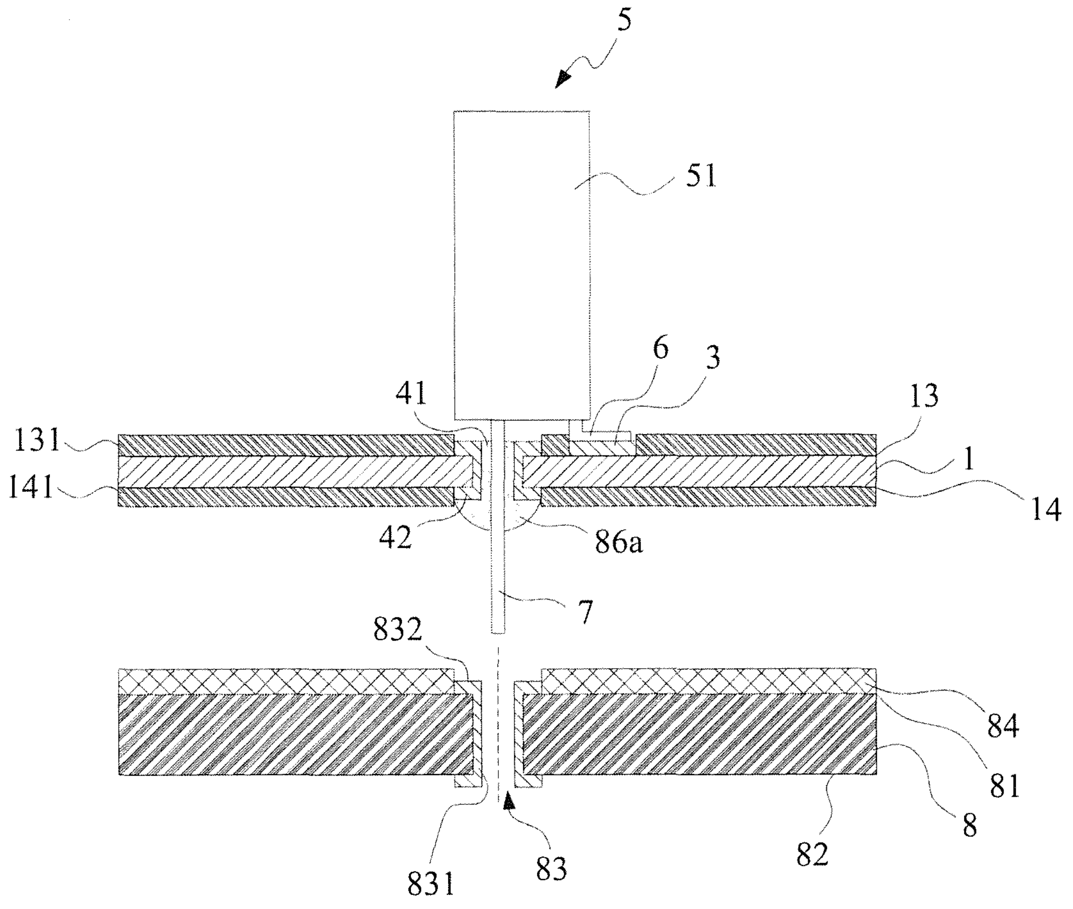
FIG. 8 is a cross-sectional view showing solder-dipping pin holes of the first embodiment of the present invention are soldered to and set in electrical connection with a first conductive layer by an additional solder material.

Referring to FIG. 8, in inserting the solder-dipping pins 7 of the connector 5 from the component surface 13 of the flexible circuit board 1 through the solder-dipping pin holes 4 of the flexible circuit board 1 to the reinforcement bonding surface 14, an additional solder material 86*a* is provided on the extended portion 42 of each of the first conductive layers 41 to solder and electrically connect each of the solder-dipping pins 7 of the connector 5 to the extended portion 42 of each of the first conductive layers 41. The solder-dipping pins 7 are then allowed to penetrate through the holes 85 of the adhesive material layer 84 and the through holes 83 of the reinforcement plate 8 to the soldering surface 82 of the reinforcement plate 8.

Figure 9:
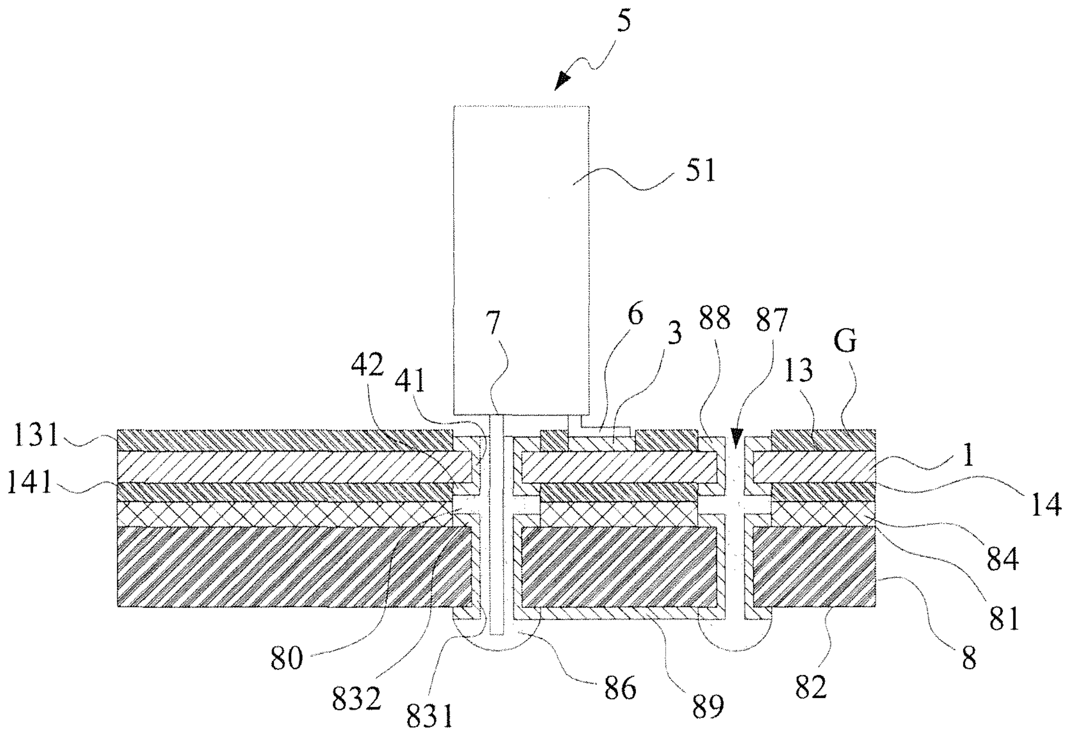
FIG. 9 is a cross-sectional view showing a second embodiment of the present invention with all components assembled together.

Referring to FIG. 9, a second embodiment of the present invention is shown, where the flexible circuit board 1 and the reinforcement plate 8 further comprise at least one jumper via hole 87 extending through the flexible circuit board 1 and the reinforcement plate 8. The jumper via hole 87 comprises a conductive material 88 therein. The soldering surface 82 of the reinforcement plate 8 further comprises at least one conductive path 89 in connection with the jumper via hole 87 and having ends connected to one of the through holes 83 of the reinforcement plate 8 and the jumper via hole 87, whereby the solder-dipping pins 7 of the connector 5 can be connected to a grounding line G or other signal lines or a power line of the component surface 13 of the flexible circuit board 1 via the through holes 83 of the reinforcement plate 8, the conductive path 89, and the conductive material 88 inside the jumper via hole 87.

Figure 10:
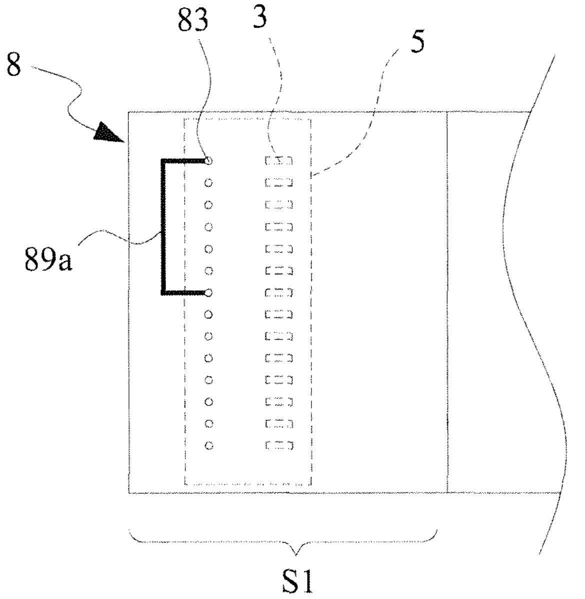
FIG. 10 is a bottom plan view showing a soldering surface of the reinforcement plate according to the present invention is further provided with at least one jumper conductive path.

Referring to FIG. 10, a bottom view of an embodiment in which the soldering surface 82 of the reinforcement plate 8 of the present invention is provided with at least one jumper conductive path 89*a* is shown. The jumper conductive path 89*a* is electrically connected to at least two of the through holes 83 of the reinforcement plate 8, whereby the solder-dipping pins 7 of the connector 5 can be connected to a signal line, a grounding line, or a power line via the jumper conductive path 89*a* of the soldering surface 82 of the reinforcement plate 8.

Figure 11:
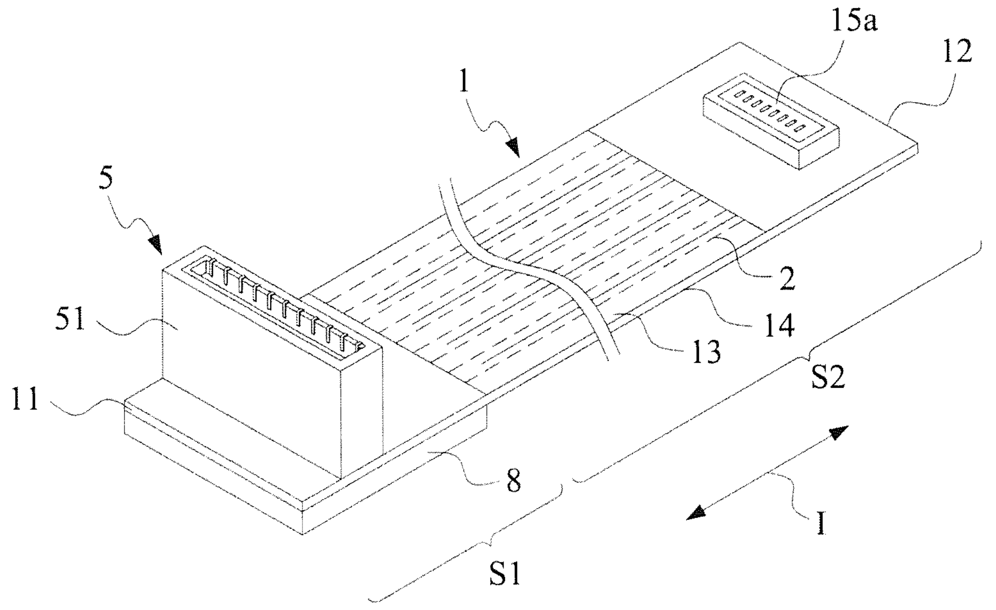
FIG. 11 is a schematic view showing a second end of the flexible circuit board according to the present invention is coupled to an insertion socket unit.
Figure 12:
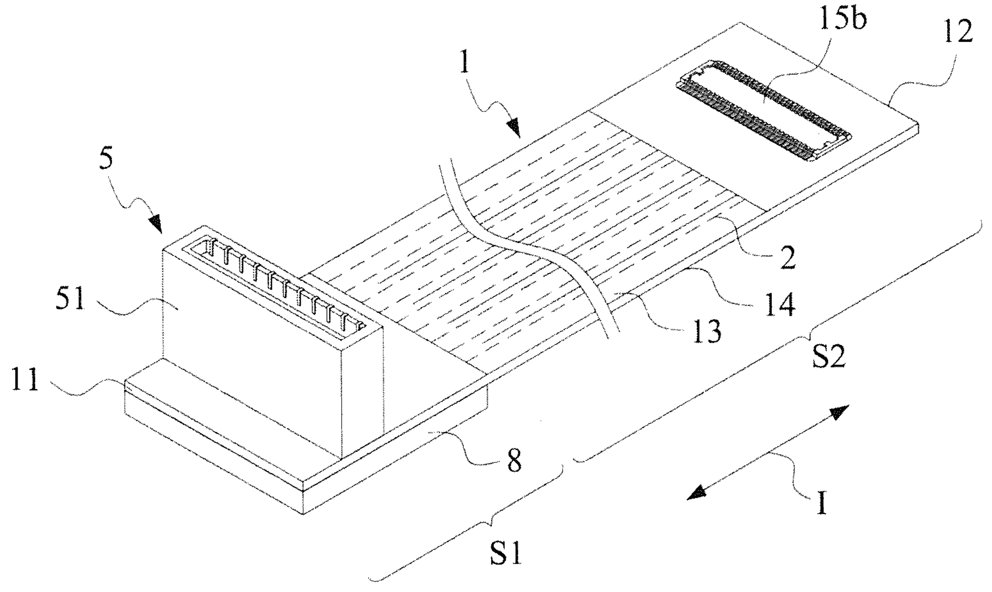
FIG. 12 is a schematic view showing the second end of the flexible circuit board according to the present invention is coupled to an electronic device.

The flexible circuit board 1 shown in FIG. 2 comprises a known golden finger insertion structure formed on the second end 12 thereof. Alternatively, as shown in FIG. 11, the second end 12 of the flexible circuit board 1 can be coupled to an insertion socket unit 15*a*, or further alternatively, as shown in FIG. 12, the second end 12 of the flexible circuit board 1 can be coupled to an electronic device 15*b*.

Figure 13:
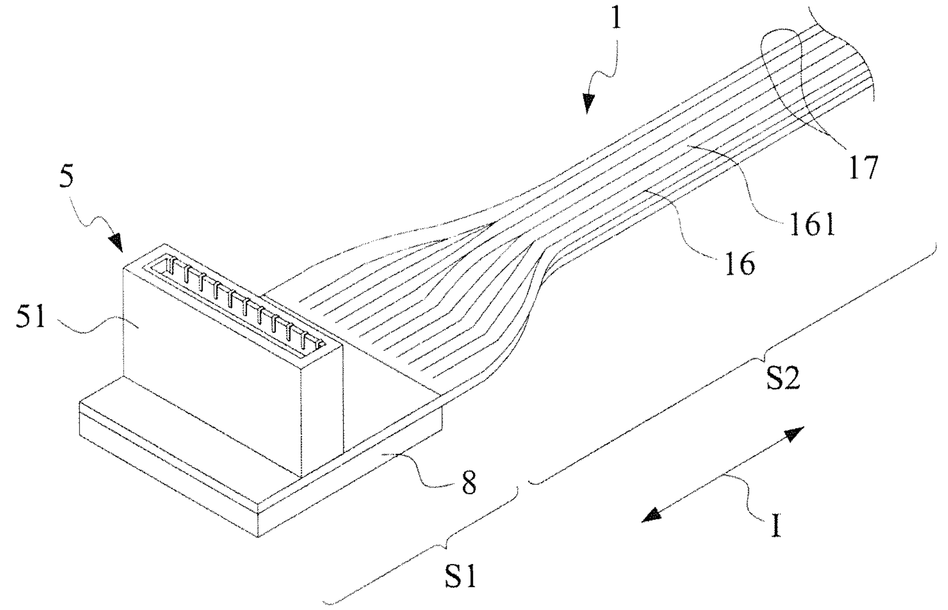
FIG. 13 is a schematic view showing the flexible circuit board is formed of a plurality of cluster lines.
Figure 14:
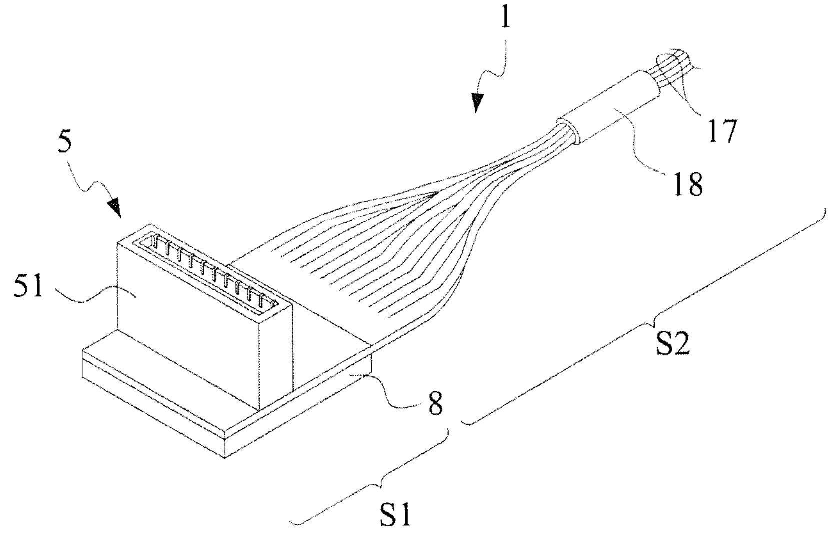
FIG. 14 is a schematic view showing the cluster lines of FIG. 13 are bundled to form a bundled structure and bunded by a bundling component.

As shown in FIGS. 13 and 14, the first extension section S2 of the flexible circuit board 1 may comprise at least one cutting line 16 formed by cutting along the extension direction I, whereby the first extension section S2 forms a plurality of cluster lines 161, which is bundled together to form a bundled structure 17 and is bunded by a bundling component 18.

Figure 15:
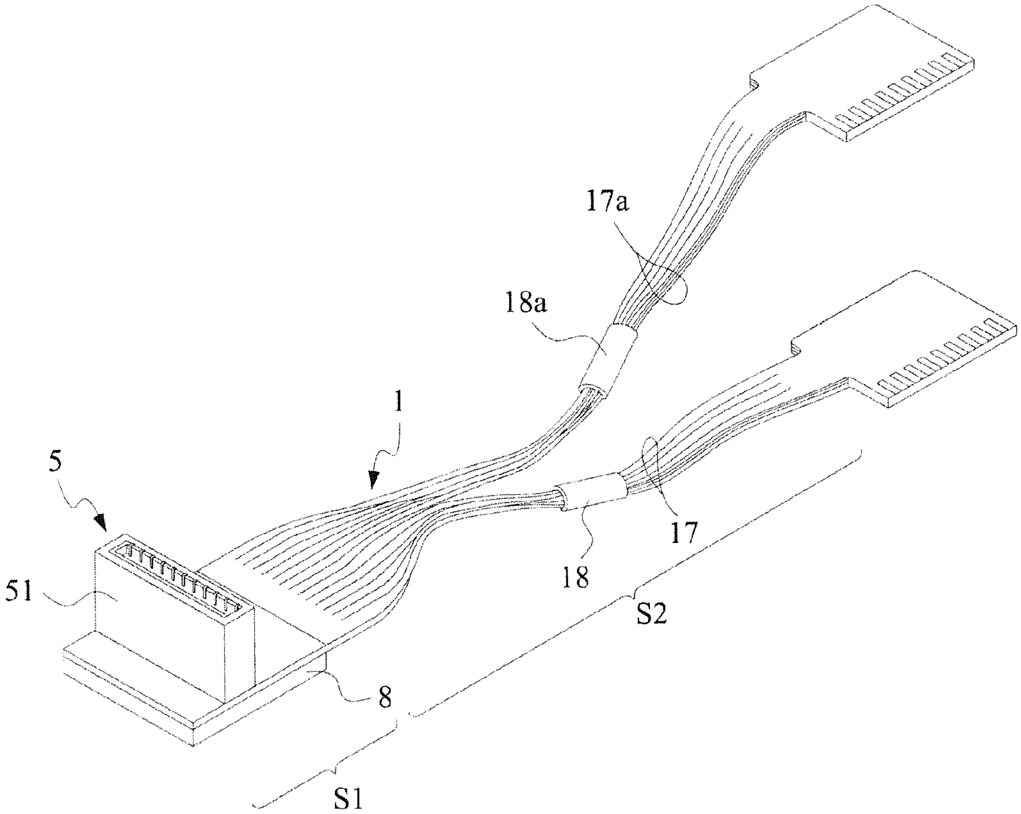
FIG. 15 is a schematic view showing an embodiment where the flexible circuit board comprises at least two bundled structures.
Figure 16:
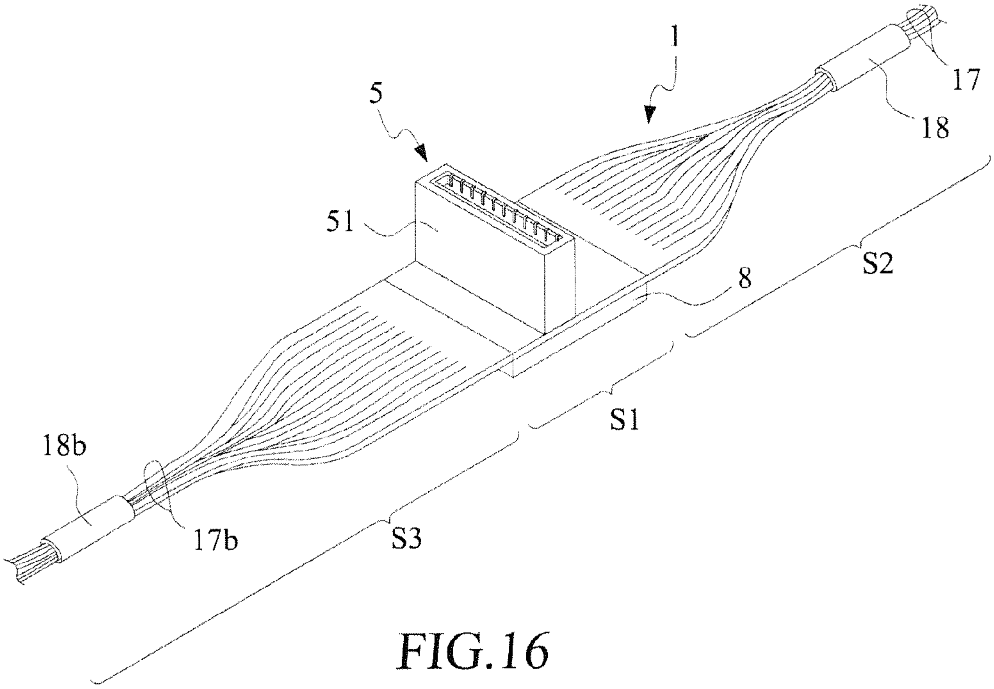
FIG. 16 is a schematic view showing an embodiment where a first end of the flexible circuit board comprises a second extension section extending therefrom.

As shown in FIGS. 15 and 16, the first extension section S2 of the flexible circuit board 1 may comprise at least two bundled structures 17, 17*a* and two bundling components 18, 18*a*, which are respectively provided on individual insertion ends, insertion socket units, or electronic devices. As shown in FIG. 16, the first end 11 of the flexible circuit board 1 may comprise at least one second extension section S3 extending in a direction opposite to the first extension section S2. The second extension section S3 may also comprise at least one bundled structure 17*b* and a bundling component 18*b*.

In the previously discussed embodiments, the plurality of SMD pins 6 of the connector 5 is arranged in a single row on the connector body 51 and the plurality of solder-dipping pins 7 is also arranged in a single row on the connector body 51. The component surface 13 of the flexible circuit board 1 is provided with a single row of SMD soldering zones 3 corresponding to the SMD pins 6 and a single row of solder-dipping pin holes 4 corresponding to the solder-dipping pins 7. Other arrangements of arrays can be alternatively adopted.

Figure 17:
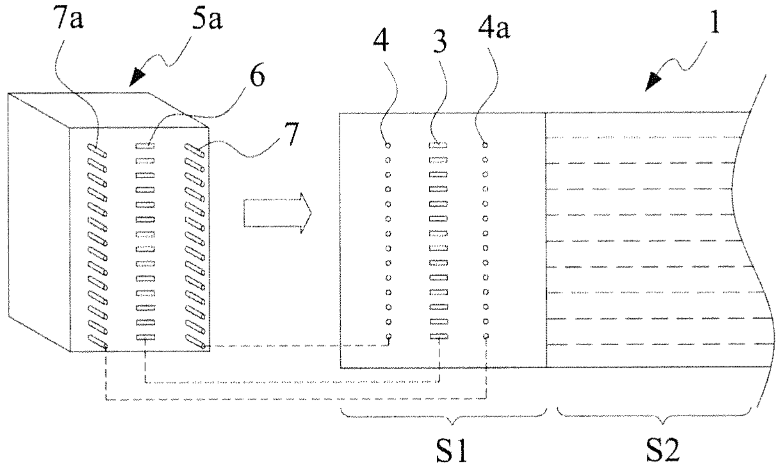
FIG. 17 shows a third embodiment of the present invention, where a pin-extended connector comprises an array of SMD pins, an array of solder-dipping pins, and at least one array of extended solder-dipping pins and the component surface of the flexible circuit board is provided with corresponding SMD pins and solder-dipping pin holes.

For example, as shown in FIG. 17, a pin-extended connector 5*a* according to a third embodiment of the present invention comprises an array of SMD pins 6, an array of solder-dipping pins 7, and at least one array of extended solder-dipping pins 7*a*. To mate the pin-extended connector 5*a*, the component surface 13 of the flexible circuit board 1 is provided with an array of SMD soldering zones 3, an array of solder-dipping pin holes 4, and at least one array of extended solder-dipping pin holes 4*a*.

Figure 18:
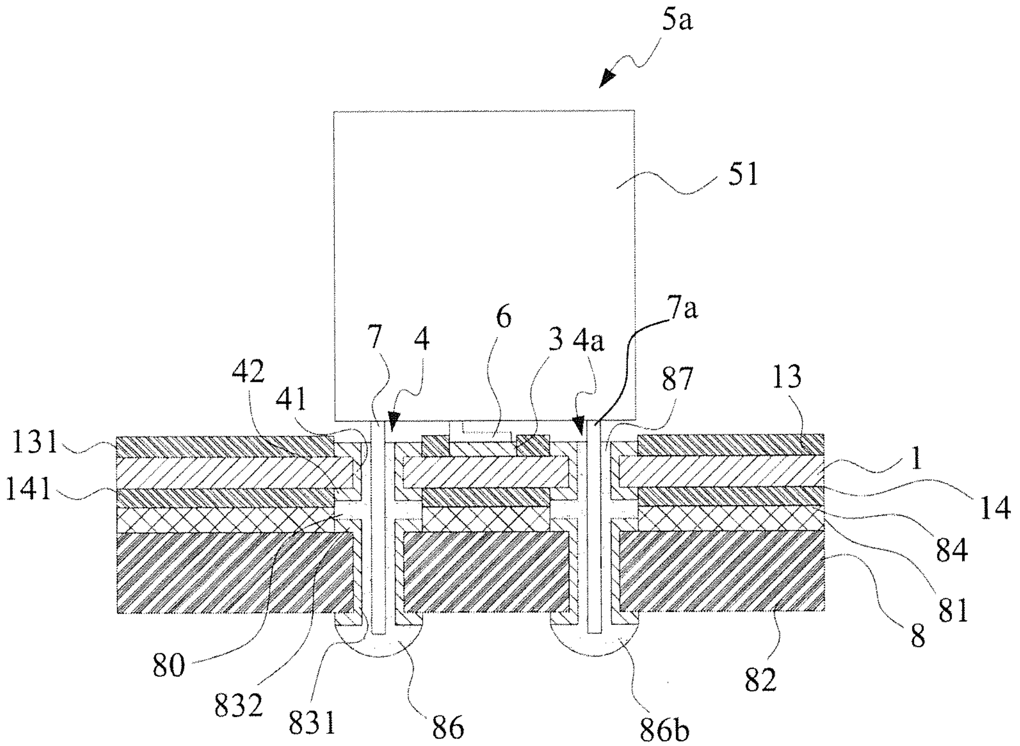
FIG. 18 is a cross-sectional view showing a condition, where the pin-extended connector of FIG. 17 is mounted to the component surface of the flexible circuit board.

FIG. 18 is a cross-sectional view showing the pin-extended connector 5*a* of FIG. 17 is coupled to the component surface 13 of the flexible circuit board 1. In the instant embodiment, the array of solder-dipping pins 7 of the pin-extended connector 5*a* is inserted through the solder-dipping pin holes 4 of the flexible circuit board 1, the holes 85 of the adhesive material layer 84, and the through holes 83 of the reinforcement plate 8 to the soldering surface 82 of the reinforcement plate 8 and is then soldered and fixed by a solder material 86. The extended solder-dipping pins 7*a* of the pin-extended connector 5*a* are inserted through the jumper via hole 87 to the soldering surface 82 of the reinforcement plate 8 and are then soldered by a solder material 86*b*.

Figure 19:
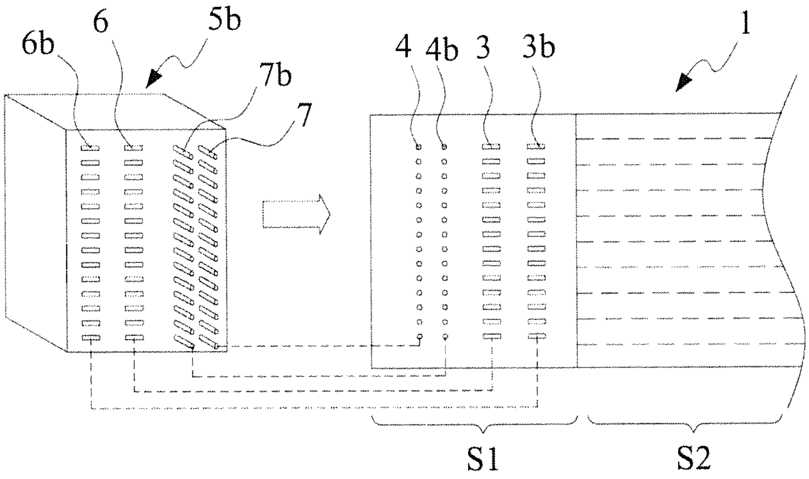
FIG. 19 shows a fourth embodiment of the present invention, where a pin-extended connector comprises an array of SMD pins, at least one array of extended SMD pins, an array of solder-dipping pins, at least one array of extended solder-dipping pins and the component surface of the flexible circuit board is provided with corresponding SMD pins and solder-dipping pin holes.

Further exemplified in FIG. 19, a pin-extended connector 5*b* comprises an array of SMD pins 6, at least one array of extended SMD pins 6*b*, an array of solder-dipping pins 7, at least one array of extended solder-dipping pins 7*b*. The component surface 13 of the flexible circuit board 1 is provided, correspondingly, with an array of SMD soldering zones 3, at least one array of extended SMD soldering zones 3*b*, an array of solder-dipping pin holes 4, and at least one array of extended solder-dipping pin holes 4*b*.

Figure 20:
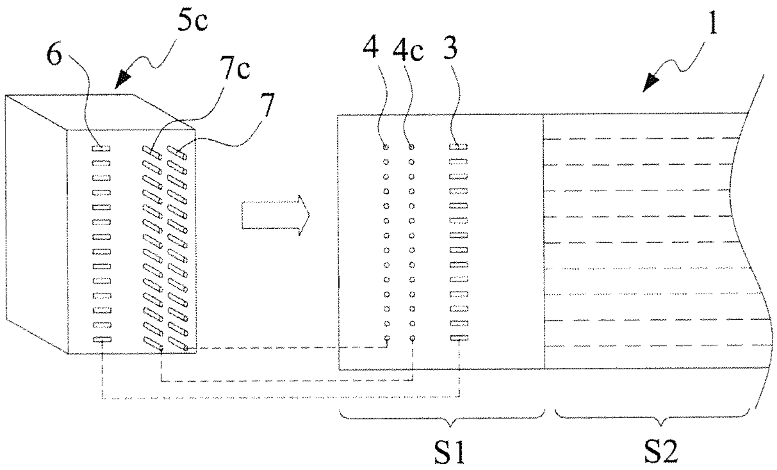
FIG. 20 shows a fifth embodiment of the present invention, where a pin-extended connector comprises an array of SMD pins, an array of solder-dipping pins, and at least one array of extended solder-dipping pins adjacent to the solder-dipping pins and the component surface of the flexible circuit board is provided with corresponding SMD pins and solder-dipping pin holes.

Further exemplified in FIG. 20, a pin-extended connector 5*c* comprises an array of SMD pins 6, an array of solder-dipping pins 7, and at least one array of extended solder-dipping pins 7*c* at a location close to the solder-dipping pins 7. The component surface 13 of the flexible circuit board 1 is provided, correspondingly, with an array of SMD soldering zones 3, an array of solder-dipping pin holes 4, and at least one array of extended solder-dipping pin holes 4*c*.

Figure 21:
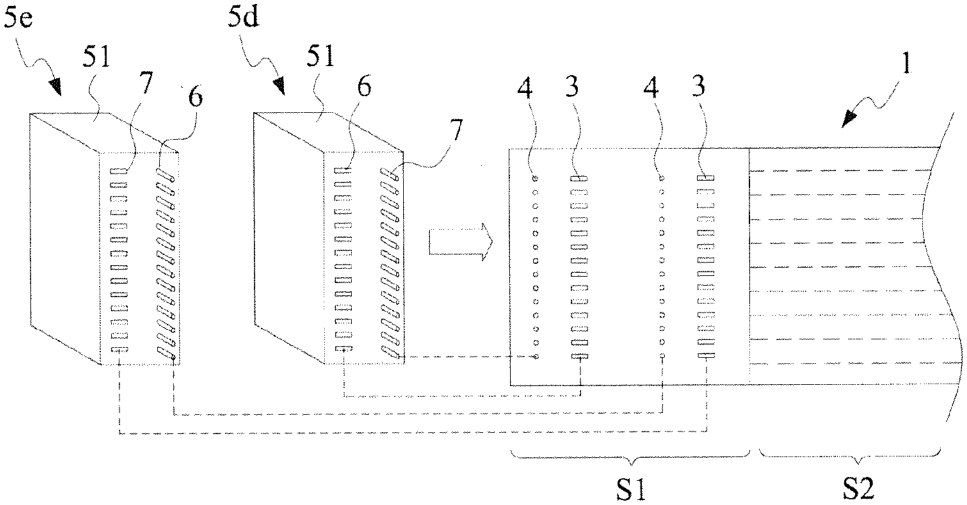
FIG. 21 shows a sixth embodiment of the present invention, where the component surface of the flexible circuit board is coupled to a first connector and a second connector.
Figure 22:
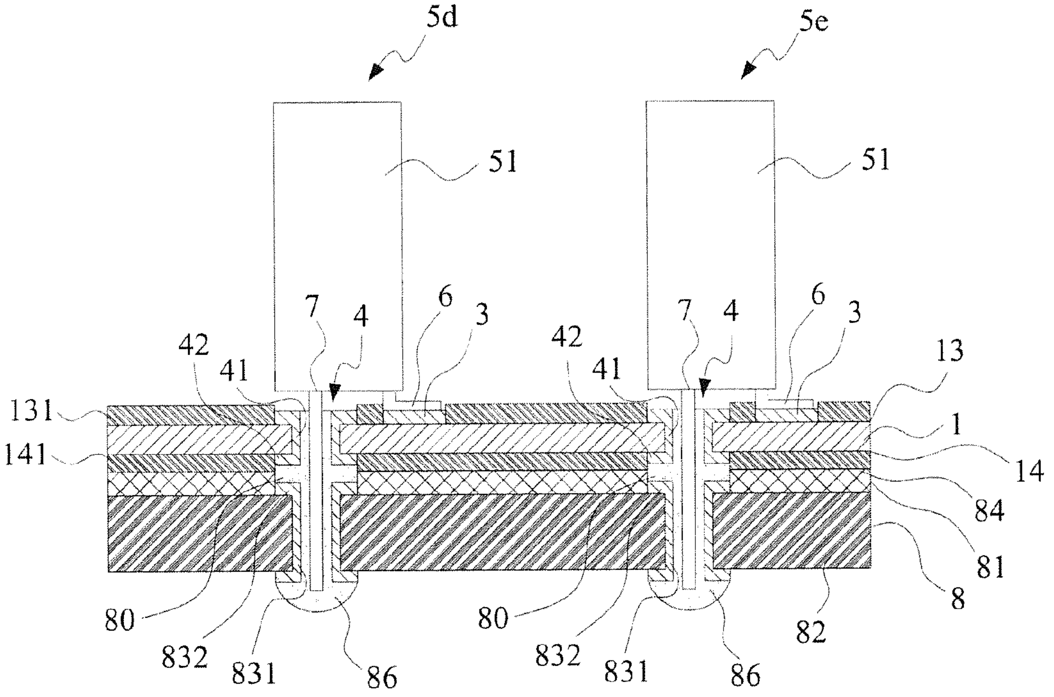
FIG. 22 is a cross-sectional view showing the first connector and the second connector of FIG. 21 are each mounted to the component surface of the flexible circuit board.

Referring to FIG. 21, a sixth embodiment of the present invention is shown, wherein the component surface 13 of the flexible circuit board 1 is coupled to a first connector 5*d* and a second connector 5*e*. FIG. 22 is a cross-sectional view showing the first connector 5*d* and the second connector 5*e* of FIG. 21 are each mounted to the component surface 13 of the flexible circuit board 1. The solder-dipping pins 7 of the first connector 5*d* are inserted from the component surface 13 of the flexible circuit board 1 through the solder-dipping pin holes 4 of the flexible circuit board 1, the holes 85 of the adhesive material layer 84, and the through holes 83 of the reinforcement plate 8, respectively, to the soldering surface 82 of the reinforcement plate 8 and are then soldered by a solder material 86. The second connector 5*e* is coupled to the flexible circuit board 1 and the reinforcement plate 8 by a similar arrangement.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A soldering structure for mounting at least one connector on a flexible circuit board, wherein:

the connector comprises a connector body and a plurality of SMD pins and a plurality of solder-dipping pins formed on the connector body;

the flexible circuit board comprises a first end, a second end, at least one first extension section extending in an extension direction between the first end and the second end, and a plurality of conductor lines formed on the first extension section, the flexible circuit board comprising a component surface and a reinforcement bonding surface, the component surface comprising a plurality of SMD soldering zones and a plurality of solder-dipping pin holes that are close to the SMD soldering zones formed thereon, the reinforcement bonding surface forming an insulation covering layer which does not cover the solder-dipping pin holes; and the soldering structure comprising:

a reinforcement plate, which comprises a bonding surface and a soldering surface, wherein the bonding surface is mounted to the reinforcement bonding surface of the flexible circuit board;

a plurality of through holes, which is formed in the reinforcement plate to respectively correspond to the solder-dipping pin holes of the flexible circuit board; and an adhesive material layer, which is interposed between the insulation covering layer of the flexible circuit board and the bonding surface of the reinforcement plate, the adhesive material layer comprising a plurality of holes corresponding to the through holes;

wherein the SMD pins of the connector are respectively soldered to the SMD soldering zones of the flexible circuit board and the solder-dipping pins of the connector are inserted from the component surface of the flexible circuit board through the solder-dipping pin holes of the flexible circuit board, the holes of the adhesive material layer, and the through holes of the reinforcement plate, respectively, to the soldering surface of the reinforcement plate to allow the solder-dipping pins of the connector to be soldered by a solder material to the through holes of the reinforcement plate;

wherein:

the solder-dipping pin holes of the flexible circuit board each have an inner circumferential surface on which a first conductive layer is formed, the first conductive layer comprising an extended portion formed on the reinforcement bonding surface; and the through holes of the reinforcement plate each have an inner circumferential surface on which a second conductive layer is formed, the second conductive layer comprising an extended portion formed on the bonding surface of the reinforcement plate;

with the adhesive material layer bonded between the insulation covering layer and the bonding surface of the reinforcement plate, the extended portion of the first conductive layer and the extended portion of the second conductive layer form therebetween a solder filling gap, whereby the solder material is allowed to flow along the solder-dipping pin of the connector and the through hole of the reinforcement plate to fill in the solder filling gap.

2. The soldering structure as claimed in claim 1, wherein with the solder-dipping pins of the connector inserted from the component surface of the flexible circuit board through the solder-dipping pin holes of the flexible circuit board to the reinforcement bonding surface, the extended portions of the first conductive layers are provided with an additional solder material to solder and electrically connect the solder-dipping pins of the connector to the extended portion of the first conductive layer, whereby the solder-dipping pins are then allowed to penetrate through the holes of the adhesive material layer and the through holes of the reinforcement plate to the soldering surface of the reinforcement plate.

3. The soldering structure as claimed in claim 1, wherein the component surface of the flexible circuit board is coupled to an upper reinforcement plate, the upper reinforcement plate comprising at least one exposed zone to expose the SMD soldering zones and the solder-dipping pin holes formed on the component surface of the flexible circuit board.

4. The soldering structure as claimed in claim 1 further comprising:

at least one jumper via, which extends through the flexible circuit board and the reinforcement plate; and at least one conductive path, which is formed on the soldering surface of the reinforcement plate and is electrically connected to one of the through holes of the reinforcement plate and the jumper via.

5. The soldering structure as claimed in claim 4, wherein the jumper via hole is electrically connected to at least one grounding line formed on the component surface of the flexible circuit board.

6. The soldering structure as claimed in claim 1, wherein the soldering surface of the reinforcement plate comprises at least one jumper conductive path formed thereon, the jumper conductive path being electrically connected to at least two through holes of the plurality of through holes.

7. The soldering structure as claimed in claim 1, wherein the adhesive material layer comprises one of pressure-sensitive adhesive and thermal-sensitive adhesive.

8. The soldering structure as claimed in claim 1, wherein the conductor lines comprise at least one set of differential mode conductor lines, the differential mode conductor lines being connected to the SMD pins of the connector.

9. The soldering structure as claimed in claim 1, wherein the conductor lines comprise at least one of one set of common mode conductor lines, a power line, and a grounding line, the one of the set of common mode conductor lines, the power line, and the grounding line being connected to the solder-dipping pins of the connector.

10. The soldering structure as claimed in claim 1, wherein the component surface of the flexible circuit board further comprises a shielding layer formed thereon, the shielding layer forming an impedance control structure.

11. The soldering structure as claimed in claim 1, wherein the reinforcement bonding surface of the flexible circuit board further comprises a lower shielding layer, the lower shielding layer forming a lower impedance control structure.

12. The soldering structure as claimed in claim 1, wherein the component surface of the flexible circuit board further comprises a shielding layer, the shielding layer forming an impedance control structure, the reinforcement bonding surface of the flexible circuit board further comprising a lower shielding layer, the lower shielding layer forming a lower impedance control structure.

13. The soldering structure as claimed in claim 1, wherein the connector comprises an array of SMD pins and an array of solder-dipping pins, the component surface of the flexible circuit board comprising, correspondingly, an array of SMD soldering zones and an array of solder-dipping pin holes formed thereon.

14. The soldering structure as claimed in claim 1, wherein the connector comprises an array of SMD pins, at least one array of extended SMD pins, and an array of solder-dipping pins, the component surface of the flexible circuit board comprising, correspondingly, an array of SMD soldering zones, at least one array of extended SMD soldering zones, and an array of solder-dipping pin holes formed thereon.

15. The soldering structure as claimed in claim 1, wherein the connector comprises an array of SMD pins, an array of solder-dipping pins, and at least one array of extended solder-dipping pins, the component surface of the flexible circuit board comprising, correspondingly, an array of SMD soldering zones, an array of solder-dipping pin holes, and at least one array of extended solder-dipping pins formed thereon.

16. The soldering structure as claimed in claim 1, wherein the first extension section of the flexible circuit board comprises at least one cutting line formed by cutting in the extension direction, whereby the first extension section forms a plurality of cluster lines.

17. The soldering structure as claimed in claim 16, wherein the cluster lines of the first extension section are bundled together to form a bundled structure and is bunded by a bundling component.

18. The soldering structure as claimed in claim 1, wherein the first end of the flexible circuit board comprises at least one second extension section extending in the extension direction.

19. The soldering structure as claimed in claim 18, wherein the second extension section comprises at least one cutting line formed by cutting in the extension direction, whereby the second extension section forms a plurality of cluster lines.

20. The soldering structure as claimed in claim 19, wherein the cluster lines are bundled together to form a bundled structure and is bundled by a bundling component.

* * * * *